United States Patent
Liles et al.

(10) Patent No.: US 7,863,665 B2
(45) Date of Patent: Jan. 4, 2011

(54) METHOD AND STRUCTURE FOR REDUCING CRACKS IN A DIELECTRIC LAYER IN CONTACT WITH METAL

(75) Inventors: Barry J. Liles, Westborough, MA (US); Colin S. Whelan, Wakefield, MA (US)

(73) Assignee: Raytheon Company, Waltham, MA (US)

( * ) Notice: Subject to any disclaimer, the term of this patent is extended or adjusted under 35 U.S.C. 154(b) by 950 days.

(21) Appl. No.: 11/693,365

(22) Filed: Mar. 29, 2007

(65) Prior Publication Data
US 2008/0239629 A1    Oct. 2, 2008

(51) Int. Cl.
H01L 27/108    (2006.01)
H01L 29/94    (2006.01)

(52) U.S. Cl. .......................... 257/303; 257/68; 257/71; 257/296; 257/306; 257/906; 257/E21.008; 257/E27.048; 257/E27.092; 257/E29.346; 438/239; 438/386; 438/393; 438/396

(58) Field of Classification Search .................... 257/68, 257/71, 296, 303, 306, 906, E21.008, E27.048, 257/E27.092, E29.346; 438/239, 386, 393, 438/396, FOR. 220
See application file for complete search history.

(56) References Cited

U.S. PATENT DOCUMENTS

| | | | |
|---|---|---|---|
| 5,216,572 A * | 6/1993 | Larson et al. | 361/313 |
| 5,646,450 A | 7/1997 | Liles et al. | |
| 5,646,459 A | 7/1997 | Liles et al. | |
| 6,323,044 B1 * | 11/2001 | Harris et al. | 438/3 |
| 2005/0189611 A1 | 9/2005 | Makioka | |
| 2006/0115950 A1 * | 6/2006 | Kim et al. | 438/381 |
| 2006/0157735 A1 | 7/2006 | Kanumura et al. | |

FOREIGN PATENT DOCUMENTS

GB    1 196 834 A    7/1970

OTHER PUBLICATIONS

Huang et al.; "Thin film cracking and ratcheting caused by temperature cycling;" J. Mater. Res., vol. 15, No. 6; Jun. 2000; pp. 1239-1242.
M. Huang, Z. Suo, "Thin Film Cracking and Ratcheting Caused by Temperature Cycling", Rapid Communications, Jun. 2000, pp. 1239-1242, vol. 15, No. 6, Santa Clara, California.
PCT/US2008/056560 International Search Report dated Jul. 4, 2008.
Wawra H, Kroner-limits of Elastic Moduli of Materials of Technical Importance, vol. 69, No. 8, Aug. 1978, pp. 518-523.

(Continued)

*Primary Examiner*—Michelle Estrada
(74) *Attorney, Agent, or Firm*—Daly, Crowley, Mofford & Durkee, LLP

(57) ABSTRACT

A method and structure for reducing cracks in a dielectric in contact with a metal structure. The metal structure comprises a first metal layer; a second metal layer disposed on, and in contact with the first metal layer, the second metal layer being stiffer than the first metal layer; a third metal layer disposed on, and in contact with the second metal layer, the second metal layer being stiffer than the third metal layer. An additional metal is included wherein the dielectric layer is disposed between the metal structure and the additional metal.

21 Claims, 2 Drawing Sheets

OTHER PUBLICATIONS

Notification Concerning Transmittal of International Preliminary Report on Patentability (Chapter 1 of the Patent Cooperation Treaty) PCT/US2008/056560, dated Oct. 8, 2009.

Written Opinion of the International Searching Authority PCT/US2008/056560 dated Jul. 4, 2008.

* cited by examiner

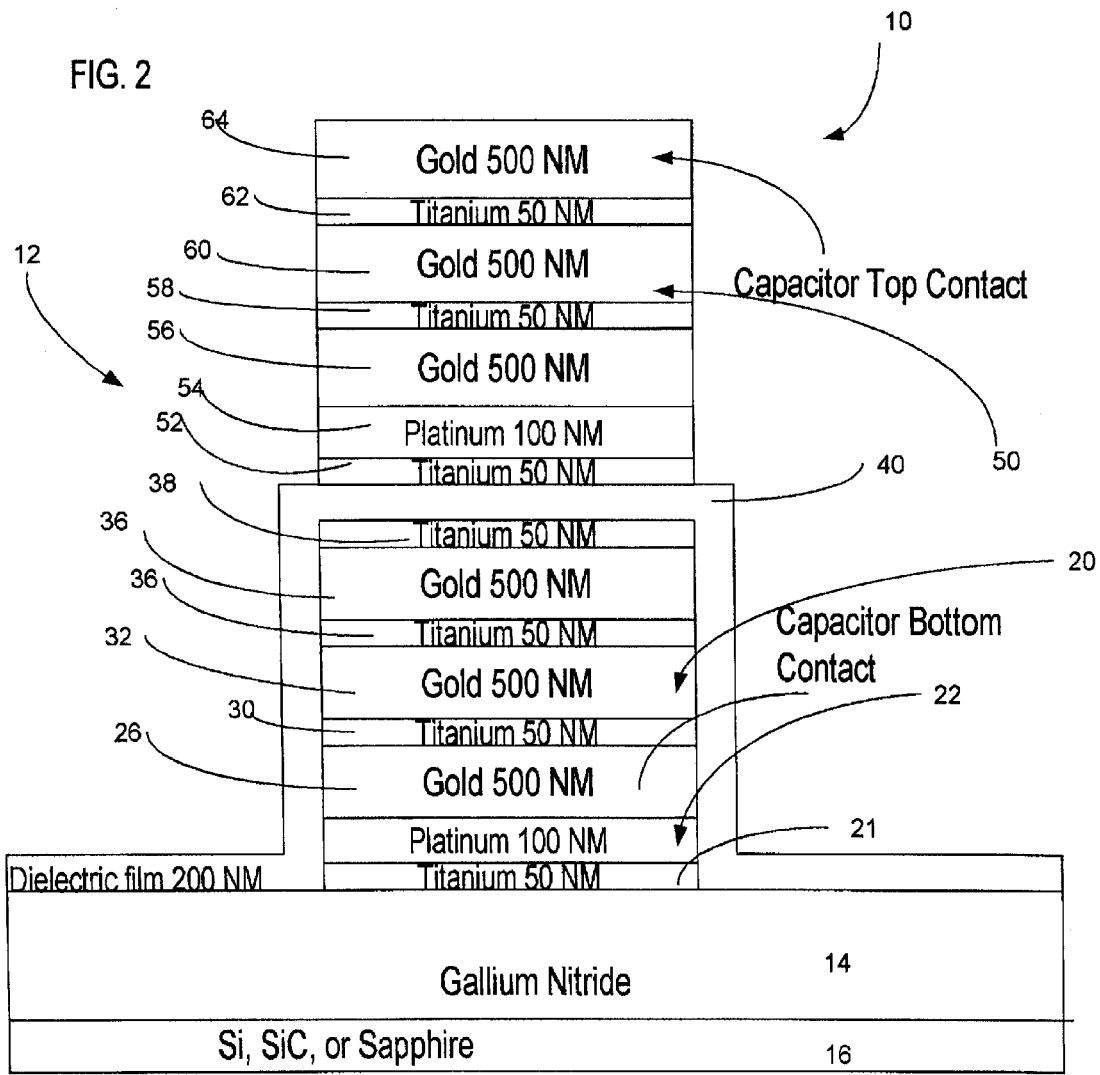

METHOD AND STRUCTURE FOR REDUCING CRACKS IN A DIELECTRIC LAYER IN CONTACT WITH METAL

TECHNICAL FIELD

This invention relates generally to dielectric layers in contact with metal and more particularly to dielectric layers in contact with metal used in integrated circuits.

BACKGROUND AND SUMMARY

As is known in the art, dielectric layers are frequently used in contact with metal. One such application is in capacitors such as those used in integrated circuits, such as monolithic microwave integrated circuits (MMICs). In such MMICs active devices may be connected to capacitors. One such capacitor is a metal-insulator-semiconductor (MIS) capacitor. One such capacitor structure used in a GaN MMIC is shown in FIG. 1. Here a layer of gallium nitride is disposed on an insulating substrate such as silicon, gallium arsenide, or silicon carbide. The capacitor includes a lower electrode made up of a lower layer of titanium, a layer of platinum on the lower layer of titanium, and a relatively thick, for example, 1500 nm thick, layer of gold on the layer of platinum. A dielectric film, such as for example, silicon nitride is used as the dielectric for the capacitor. The upper electrode for the capacitor includes a lower layer of titanium on the dielectric layer, a layer of platinum on the layer of titanium, and a relativity thick, for example, 1000 nm thick, layer of gold on the layer of platinum. It is noted that the bottom metal can be Ti/Au or just Au.

As is also known in the art, there are a number of process steps that have temperature cycles. For example, SiN deposition is about 300 degrees C. and each photolithographic step can be 150 degrees C. or so; there are also typically stabilization bakes at the end of the process; and finally, the mounting process (solder) is typically 280-320 C.

We have noted that the thermal expansion coefficient of the gold is much larger that the thermal expansion coefficient of the GaN, and, as a result, the ductile gold is irreversibly deformed during thermal cycling. The exact shape of the deformation depends on the shape of the capacitor and its location on the die, but the edge of the gold film will often slope inward after thermal cycling stressing the dielectric film that covers that edge. Our examination of SEM photos of cracks in the capacitor dielectrics shows that this is usually what happens with the observed cracks originating at the edge of the gold film.

Prior attempts had involved changing the shape and the layout of the capacitors (rounding corners, etc.). These changes helped, but did not eliminate the cracking.

In accordance with the present invention, a structure is provided comprising: a dielectric layer; and a metal structure deposed in contact with the dielectric layer. The metal structure comprises: a first metal layer; a refractory metal layer disposed in contact with the first metal layer; and a third metal layer disposed in contact with the second metal layer.

In one embodiment, the first metal layer is a metal in a group consisting of gold, silver, copper and aluminum.

In one embodiment, the third metal layer is a metal in a group consisting of gold, silver, copper and aluminum.

In one embodiment, the refractory metal is a group consisting of titanium, tungsten, molybdenum, and chromium.

In one embodiment, a semiconductor structure is provided having: a substrate; a dielectric layer disposed over the substrate; and a metal structure in contact with the dielectric layer. The metal structure comprises: a first metal layer; a second metal layer disposed in contact with the first metal layer, the second metal layer being stiffer than the first metal layer; a third metal layer disposed under, and in contact with the second metal layer, the second metal layer being stiffer than the third metal layer.

In one embodiment, the first and third metal layers are gold and the second metal is titanium. With such a structure, thin layers of titanium distributed through the gold are included to stiffen the gold layer and to reduce the permanent deformation produced by thermal cycling. Reducing the deformation of the bottom electrode eliminated the cracking of the dielectric. Thus, we have recognized that cracking during thermal cycling of dielectric films deposited on the metal films normally used in microelectronic structures can be eliminated if a stiffened metal film is substituted for the ductile metal films (e.g., pure copper, aluminum, silver or gold) that are typically used. One method of stiffening a ductile metal film (such as pure gold) while retaining its electrical conductivity is to alternate layers of the ductile metal with layers of a stiff metal (such as titanium, chromium, or molybdenum); that is with a metal stiffer than the ductile metal.

In one embodiment, an additional metal is included wherein the dielectric layer is disposed between the metal structure and the additional metal.

In one embodiment, the additional metal comprises a second metal structure and wherein the second metal structure comprises: a fourth metal layer; a fifth metal layer disposed on, and in contact with the fourth metal layer, the fifth metal layer being stiffer than the fourth metal layer; a sixth metal layer disposed on, and in contact with the fifth metal layer, the fifth metal layer being stiffer than the sixth metal layer.

In one embodiment, the second metal layer is a refractory metal.

In one embodiment, the first metal layer is a metal in a group consisting of gold, silver, copper and aluminum.

In one embodiment, the third metal layer is a metal in a group consisting of gold, silver, copper and aluminum.

In one embodiment, the refractory metal is a group consisting of titanium, tungsten, molybdenum, and chromium.

In one embodiment, a capacitor is provided. The capacitor includes: a dielectric layer; a metal structure deposed in contact with the dielectric layer. The metal structure comprises: a first metal layer; a second metal layer disposed on, and in contact with the first metal layer, the second metal layer being stiffer than the first metal layer; a third metal layer disposed on, and in contact with the second metal layer, the second metal layer being stiffer than the third metal layer; and an additional metal, wherein the dielectric layer is disposed between the metal structure and the additional metal.

In one embodiment, the capacitor includes an additional metal structure and wherein the second metal structure comprises: a fourth metal layer; a fifth metal layer disposed on, and in contact with the fourth metal layer, the fifth metal layer being stiffer than the fourth metal layer; a sixth metal layer disposed on, and in contact with the fifth metal layer, the fifth metal layer being stiffer than the sixth metal layer.

In one embodiment, the second metal layer of the capacitor is a refractory metal.

In one embodiment, the first metal layer of the capacitor is a metal in a group consisting of gold, silver, copper and aluminum.

In one embodiment, the third metal layer of the capacitor is a metal in a group consisting of gold, silver, copper and aluminum.

In one embodiment, the refractory metal of the capacitor is a group consisting of titanium, tungsten, molybdenum, and chromium.

In accordance with another feature of the invention, a method is provided for reducing cracks in a dielectric layer. The method comprises: depositing a metal structure in contact with the dielectric layer, such metal structure comprising: a first metal layer; a refractory metal layer disposed on, and in contact with the first metal layer; a third metal layer disposed on, and in contact with the second metal layer.

In one embodiment, the first metal layer is a metal in a group consisting of gold, silver, copper and aluminum.

In one embodiment, the third metal layer is a metal in a group consisting of gold, silver, copper and aluminum.

In one embodiment, the refractory metal is a group consisting of titanium, tungsten, molybdenum, and chromium.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2 is a cross sectional sketch of a capacitor according to the invention.

Like reference symbols in the various drawings indicate like elements.

DETAILED DESCRIPTION

Figure 1:
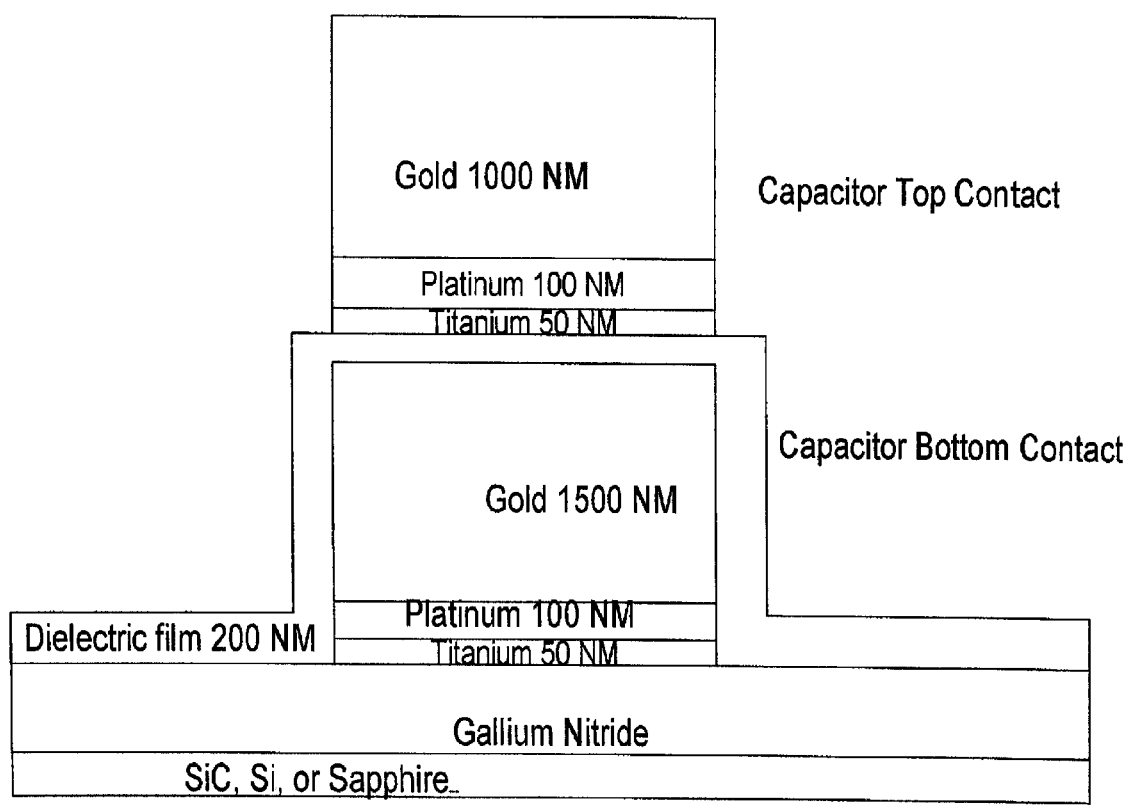
FIG. 1 is a cross sectional sketch of a capacitor according to the PRIOR ART.

Referring now to FIG. 2, a semiconductor stricture 10 is shown such as may be used in a microwave integrated circuit (MMIC). Here, a capacitor 12 for such MMIC is shown having a layer 14 of gallium nitride disposed on an insulating substrate 16 such as silicon, sapphire, diamond, or silicon carbide.

The capacitor 12 includes a lower electrode made up of a conductive structure 20. The structure 20 includes a lower layer 21 of titanium, here 50 nm thick, on and in contact with the gallium nitride 14; a layer 22 of platinum, here 100 nm thick, on and in contact with the lower layer 21 of titanium, and a laminated structure comprising interleaved layers of gold and titanium. It is noted that the gold is a ductile material compared with the titanium. The gold is less elastic (less stiff than the highly elastic (stiffer) titanium.

More particularly, the laminated structure here includes a lower layer 26 of gold, here 500 nm thick, (more generally greater than 100 nm), on and in contact with the layer 21 of platinum; a layer 30 of titanium, here 50 nm thick, (more generally greater than 10 nm), on and in contact with layer 26; a layer 32 of gold, here 500 nm thick, (more generally greater than 100 nM), on and in contact with layer 30; a layer 36 of titanium, here 50 nm thick, (more generally greater than 10 nm), on and in contact with layer 32; a layer 36 of gold, here 500 nm thick, (more generally greater than 100 nm) on and in contact with layer 36; and a layer 38 of titanium, here 50 nm thick, (more generally greater than 10 nm), on and in contact with layer 36. It should be understood that other metals such as refractory metals including tungsten, chromium, or molybdenum, might be used in place of the titanium. Further, other highly electrically conductive ductile materials may be used for the gold, such as silver, aluminum or copper. Still further more or less layers may be used in the laminated structure and other thickness for such layers may be used. Here, the layers in the conductive structure are electron beam deposited, but other methods of deposition such as sputtering can be used.

The capacitor 12 has a dielectric layer 40, here, for example, a 200 nm thick layer, (more generally in the range from 50 nm to 500 nm) of silicon nitride. It should be noted that other dielectric materials, such as $SiO_2$ and silicon oxynitrides may be used. The upper electrode for the capacitor 12 is a conductive structure 50. The conductive structure 50 includes a lower layer 52 of titanium, here 50 nm thick, (more generally greater than 10 nm), on and in contact with the dielectric layer 40; an optional layer 54 of platinum, here 100 nm thick, (more generally greater than 10 nm), on and in contact with the lower layer 52 of titanium, and a laminated structure comprising interleaved layers of gold and titanium. It is noted that the gold is a ductile material compared with the titanium. The gold is less elastic (less stiff) than the highly elastic (stiffer) titanium.

More particularly, the laminated structure here includes a lower layer 56 of gold, here 500 nm thick (more generally greater than 100 nm), on and in contact with layer 54; a layer 58 of titanium, here 50 nm thick, (more generally greater than 10 nm), on and in contact with layer 56; a layer 60 of gold, here 500 nm thick, (more generally greater than 100 nm), on and in contact with layer 58; a layer 62 of titanium, here 50 nm thick, (more generally greater than 10 nm), on and in contact with layer 60, and a layer 64 of gold, here 500 nm thick, (more generally greater than 10 nm), on and in contact with layer 62. It should be understood that other metals such as refractory metals including tungsten, chromium, or molybdenum, might be used in place of the titanium. Further, other highly electrically conductive ductile materials may be used for the gold, such as silver, aluminum or copper. Still further, more or less layers may be used in the laminated structure and other thickness for such layers may be used. Here, the layers in the conductive structure are electron beam deposited, but may also be sputtered or plated, or a combination thereof.

A number of embodiments of the invention have been described. Nevertheless, it will be understood that various modifications may be made without departing from the spirit and scope of the invention. Accordingly, other embodiments are within the scope of the following claims.

What is claimed is:

1. A semiconductor structure, comprising:
   a metal structure comprising:
      a first metal layer;
      a second metal layer disposed over the first metal layer, the first metal layer being stiffer than the second metal layer;
      a third metal layer disposed on, and in contact with the second metal layer, the third metal layer being stiffer than the second metal layer; and
      a fourth metal layer disposed on and in contact with the third metal layer, the third metal layer being stiffer than the fourth metal layer.

2. The structure recited in claim 1 including a fifth metal layer on and in contact with the first metal layer and disposed under the second metal layer.

3. The structure recited in claim 1 including a dielectric layer over the metal structure and including a second metal structure on the dielectric layer, such second metal structure comprising:
   a fifth metal layer disposed on and it contact with the dielectric layer;
   a sixth metal layer disposed over fifth-metal layer, the fifth metal layer being stiffer than the sixth metal layer;

a seventh metal layer disposed on, and in contact with the sixth metal layer, the seventh metal layer being stiffer than the sixth metal layer.

4. The structure recited in claim 1 wherein the first metal layer is a refractory metal.

5. The structure recited in claim 4 wherein the second metal layer is a metal in a group consisting of gold, silver, copper and aluminum.

6. The structure recited in claim 5 wherein the third metal layer is a refractory metal layer.

7. The structure recited in claim 4 wherein the refractory metal is a group consisting of titanium, tungsten, molybdenum, and chromium.

8. A capacitor, comprising:
   a metal structure, comprising:
      a first metal layer;
      a second metal layer disposed over the first metal layer, the first metal layer being stiffer than the second metal layer;
      a third metal layer disposed on, and in contact with the second metal layer, the third metal layer being stiffer than the second metal layer;
      a fourth metal layer disposed on and in contact with the third metal layer, the third metal layer being stiffer than the fourth metal layer;
   a dielectric layer; and
   an additional metal, wherein the dielectric layer is disposed between the metal structure and the additional metal.

9. The capacitor recited in claim 8 wherein the additional metal comprises a second metal structure and wherein the second metal structure comprises;
   a fifth metal layer disposed on and in contact with the dielectric layer;
   a sixth metal layer disposed over fifth metal layer, the fifth metal layer being stiffer than the sixth-metal layer;
   a seventh metal layer disposed on, and in contact with the sixth metal layer, the seventh metal layer being stiffer than the sixth metal layer.

10. The capacitor recited in claim 8 wherein the first metal layer is a refractory metal.

11. The capacitor recited in claim 8 wherein the second metal layer is a metal in a group consisting of gold, silver, copper and aluminum.

12. The capacitor recited in claim 8 wherein the third metal layer is a refractory metal.

13. The capacitor recited in claim 12 wherein the refractory metal layer of the first layer and third layer is a metal in a group consisting of titanium, tungsten, molybdenum, and chromium.

14. A structure, comprising:
   a metal structure comprising:
      a first refractory metal layer;
      a first non-refractory metal layer disposed over first refractory metal layer;
      a second refractory metal layer disposed on, and in contact with the first non-refractory metal layer and
      a second non-refractory metal layer disposed on and in contact with the second non-refractory metal layer.

15. The structure recited in claim 14 wherein the first non-refractory metal layer and the second non-refractory layer is a metal in a group consisting of gold, silver, copper and aluminum.

16. The structure recited in claim 15 wherein the first refractory layer and the second refractory layer is a metal in a group consisting of titanium tungsten, molybdenum, and chromium.

17. The structure recited in claim 16 including a platinum layer disposed on and in contact with the first refractory layer and in contact with the first non-refractory metal layer.

18. A method for reducing cracks in a dielectric layer, comprising:
   depositing a metal structure in contact with the dielectric layer, such metal structure comprising:
      a first refractory metal layer disposed on the dielectric layer;
      a first non-refractory metal layer disposed over the first refractory metal layer;
      a second refractory metal layer disposed on, and in contact with the first non-refractory metal layer and
      a second non-refractory metal on and in contact with the second refractory metal layer.

19. The method recited in claim 18 wherein the non-refractory metal is a metal in a group consisting of gold, silver, copper and aluminum.

20. The method recited in claim 19 wherein the refractory metal is a metal in a group consisting of titanium, tungsten, molybdenum, and chromium.

21. The method recited in claim 20 wherein including a layer of platinum between the first refractory metal layer and the first non-refractory metal layer.

* * * * *